United States Patent
Strong

(10) Patent No.: US 8,660,154 B1
(45) Date of Patent: Feb. 25, 2014

(54) LASER DEVICE WITH DIGITALLY CONTROLLED RESONATOR

(75) Inventor: Jasmine Louise Strong, San Francisco, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/347,160

(22) Filed: Jan. 10, 2012

(51) Int. Cl.
*H01S 3/121* (2006.01)

(52) U.S. Cl.
USPC .................................. 372/15; 372/14; 372/10

(58) Field of Classification Search
USPC ................................................ 372/15, 14, 10
See application file for complete search history.

(56) References Cited

U.S. PATENT DOCUMENTS

2002/0018496 A1* 2/2002 Gutin ............................... 372/20
2008/0144675 A1* 6/2008 Spinelli et al. .................. 372/15

OTHER PUBLICATIONS

Foth, Dr. Hans-Jochen and Dr. Ralf Knappe, "Laser Power Beaming Feasibility: Non-Mechanical Beam Steering Options, Laser Phase-Locking and Control", Report; ESTEC/Contract No. 18153/04/NL/MV, Kaiserslautern, Jun. 29, 2004, 40 pages.
McManamon, Paul F., et al., "A Review of Phased Array Steering for Narrow-Band Electrooptical Systems", Proceedings of the IEEE, vol. 97, No. 6, Jun. 2009, pp. 1078-1096.

* cited by examiner

*Primary Examiner* — Kinam Park
(74) *Attorney, Agent, or Firm* — Foley & Lardner LLP; John D. Lanza

(57) ABSTRACT

A digitally-controllable laser apparatus includes a resonator, which includes a two-dimensional micromirror array, and an output facet configured to output a laser beam. The array has a controllable two-dimensional reflectivity to provide control of a two-dimensional wave front of the laser beam. A digitally-controlled Q-switching of the laser apparatus, and shaping of the laser beam wave front to thereby steer the laser beam can be realized.

18 Claims, 6 Drawing Sheets

US 8,660,154 B1

LASER DEVICE WITH DIGITALLY CONTROLLED RESONATOR

BACKGROUND

Laser pulse formation can be achieved using mode locking or Q-switching. For example, external-cavity laser diodes can use a diffraction grating to modify the output wave front and to mode-lock the diode. On the other hand, a Q-switched laser can use a variable attenuator to initially reduce the Q-factor (quality factor) of the laser optical resonator, thereby increasing population inversion, and the attenuator is subsequently "switched" to achieve a high Q-factor, thereby producing a Q-switched pulse. An external seed laser beam can be used to modulate the Q-switched laser output.

SUMMARY

In one aspect, a laser apparatus is provided including a resonator. The resonator includes a two-dimensional micromirror array, and an output facet configured to output a laser beam. The array has a controllable two-dimensional reflectivity to provide control of a two-dimensional wave front of the laser beam. For example, a digitally-controlled Q-switching of the laser apparatus and shaping of the laser beam wave front to thereby steer the laser beam can be realized.

In one embodiment, the micromirror array includes a MEMS device.

In one embodiment, the micromirror array includes a plurality of reflective pixels configured to be individually controllable in at least one of: a reflectivity; a phase of light reflected thereof; or selective reflection of light of a specified wavelength. The micromirror array can be configured to steer the laser beam by selectively controlling phases of light reflected from the plurality of reflective pixels, and/or to mode-lock the laser beam.

In one embodiment, the output facet includes a Brewster-angled surface to output polarized light.

In one embodiment, the laser apparatus further includes an active region disposed in the resonator. The active region can be that of a semiconductor laser diode, such as an edge-emitting laser diode or a VCSEL. In one example, the semiconductor laser diode is a multi-mode laser diode.

In one embodiment, the active region is that of an Nd:YAG laser.

In one embodiment, the laser apparatus further includes a beam sensor disposed in the laser beam to measure beam quality data. The beam sensor can include a beam picker configured to obtain a low-intensity image of the laser beam, and a phase sensor to measure phases over a wave front of the laser beam.

In one embodiment, the laser apparatus further includes a controller configured to individually control reflectivities of pixels of the micromirrar array, and a control circuit to drive the controller based on feedback of the measured beam quality data.

In one embodiment the laser apparatus further includes a first collimator lens disposed in the resonator and configured to collimate light toward the micromirror array. A second collimator lens can be disposed outside the resonator and in the laser beam to collimate the laser beam.

In another aspect, a method is provided for controlling a laser beam. The method includes measuring beam quality data of the laser beam, feeding the beam quality data to a control circuit, generating digital control signals using the control circuit based on the beam quality data, and controlling a two-dimensional wave front of the laser beam by adjusting a two-dimensional reflectivity of a resonator back surface.

In one embodiment, the method further includes Q-switching by controlling the two-dimensional reflectivity of the resonator back surface.

In another embodiment, the method further includes steering the laser beam by controlling the two-dimensional reflectivity including its imaginary components.

In another aspect, an optical drive system is provided including a laser apparatus. The laser device includes a resonator. The resonator includes a two-dimensional micromirror array, and an output facet configured to output a laser beam. The array is controllable to provide a digitally-controlled Q-switching of the laser apparatus and shaping of the laser beam wave front to thereby steer the laser beam. A drive circuit can be used to control a quality of the laser beam. An encoder/decoder circuit can be used to encode/decode the laser beam. The system also includes a host computer to control the drive circuit and the encoder/decoder circuit.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

DETAILED DESCRIPTION

Following below are more detailed descriptions of various concepts related to, and embodiments of, inventive methods and apparatus for a laser with a digitally controlled resonator. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Figure 1A:
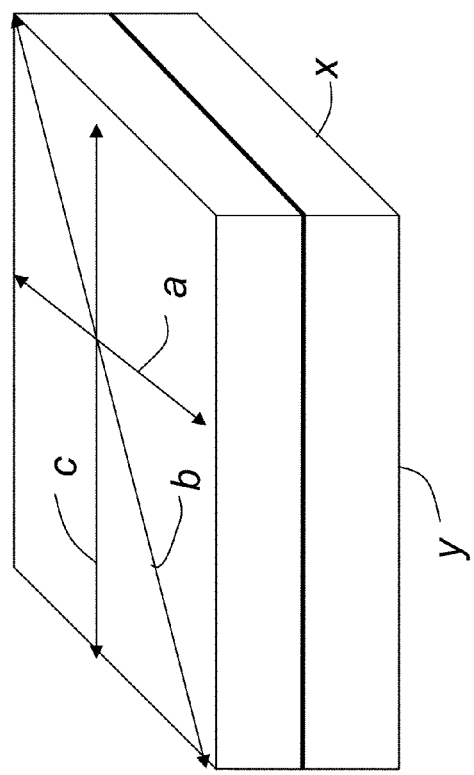
FIG. 1A and FIG. 1B illustrate an active region of a laser diode.
Figure 1B:
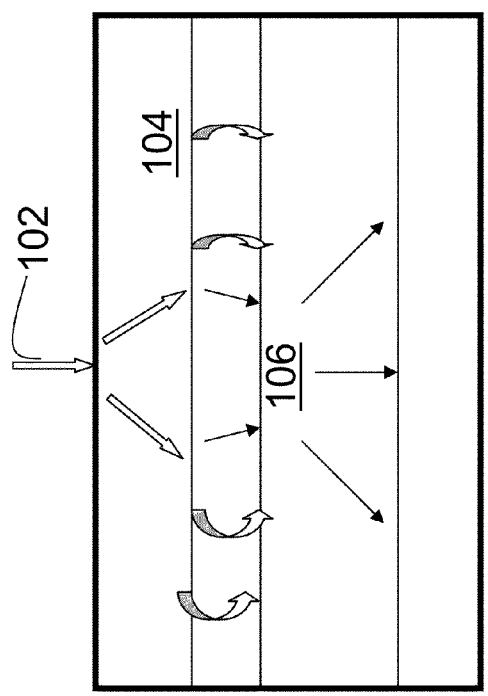

FIG. 1A and FIG. 1B illustrate an active region of an index-guided, edge-emitting laser diode. As shown in FIG. 1A, a transverse dimension a corresponds to the fundamental axis x. Another transverse dimension c corresponds a "fast" axis (in terms of charged carrier transfer) y. The diagonal dimension b corresponds to a parasitic "slow axis," and $b = \sqrt{x^2 + y^2}$. Thus, the corresponding beam divergence of c is much larger than that of b.

As illustrated in FIG. 1B, electrical current 102 is injected into top contact layer 104, and spreads in active layer 106. As the electrical current increases, the effective active region increases in size, until the charged carriers are exhausted and the gain is saturated. During this process, the angle of b increases, and thus the laser beam geometry changes with the electrical current. Lasing can occur where gain exceeds path loss. The angle increases as the current increases because in the index-guided laser diode the light is constrained within the active layer of the diode by the fact that the population inversion modifies the index of refraction of the material. Because the population inversion is created by the current through the diode, and because a semiconductor has a relative paucity of charged carriers, this means that the current starts out as a relatively small channel vertically through the active layer 106, and as higher currents are reached, the conduction path spreads out laterally to involve more of the active layer 106. This can be seen from examination of the output modes of the index-guided diode. The diode may run in a single mode at low currents, and then break out into multimode operation at higher currents when the current is spread across a wider part of the active layer. As a result, the divergence increases with current.

The divergence of the beam is an important parameter of the laser diode as it determines what optics may be needed on the output of the laser. If divergence changes during operation of the laser, then the optical system needs to be more complex to control the final disposition of energy at the output. Due to the fact that optics are generally reversible (as electromagnetics are time-invariant), the product of the emitter size and the divergence at the emitter can be a constant. As a result, one can trade spot size for divergence, or vice-versa, but the beam "waist" at the focal point in general is no smaller than the size of the emitter, even with very short focal length optics. This therefore imposes a limit on, for example, the minimum size of a recorded "bit" on an optical disc in optical recording applications.

A laser diode typically operates at a milliwatt (mW) order of magnitude. Increasing the drive electrical current to increase the power output of a laser diode may make the active region larger, and the laser diode may transition from single mode to multimode. Further, the active region with an increased size also tends to change the shape of the output beam wave front. This together with the diffraction at the output coupler facet 208 may degrade the wave front. Thus, the power increase of a laser diode typically is associated with degraded beam quality.

Figure 2:
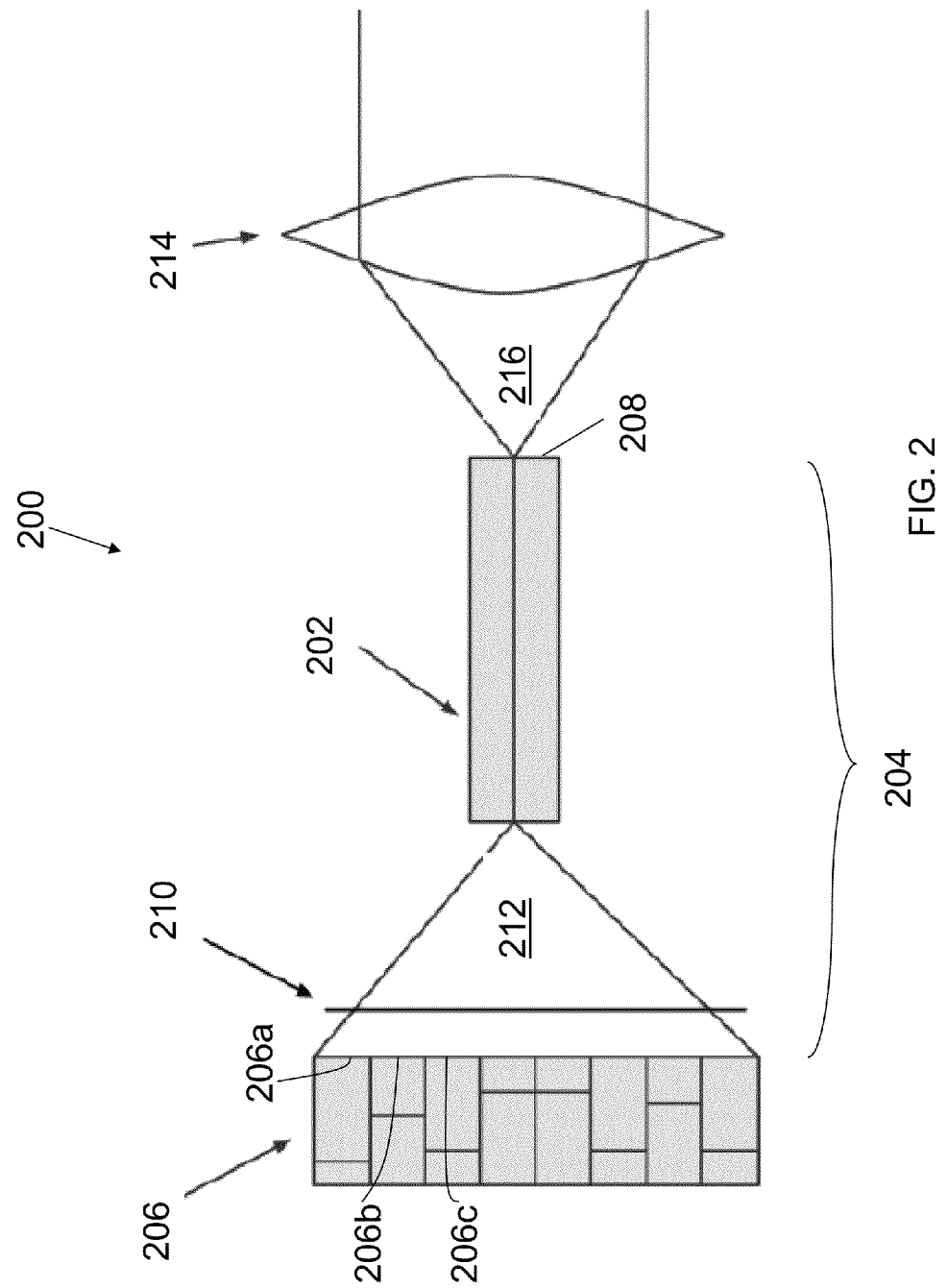
FIG. 2 illustrates a laser apparatus including a digitally-controlled micromirror array according to one embodiment of the invention.

As illustrated in FIG. 2, a laser apparatus 200 according to one embodiment of the invention may include a laser diode 202. The laser diode 202 can be a multimode laser diode. In another embodiment, the laser diode 202 represents a plurality of laser diodes forming an array, and the plurality of laser diodes can be individually controlled. In the example shown, the laser diode is an edge-emitting laser, which can be a heterostructure semiconductor laser for example. In some other embodiments, other types of semiconductor lasers, such as vertical-cavity surface-emitting lasers (VCSELs) can be used. Further, it is noted that embodiments of the invention are not limited to solid state lasers such as semiconductor lasers. Other types of lasers, such as Nd:YAG lasers, as well as gaseous lasers including both pulsed and continuous-wave lasers, can also be used.

As shown, the laser diode 202 is disposed in a resonator 204. One side (e.g., backside) of the resonator 204 includes a micromirror array 206. The micromirror array 206 can be an interferometric modulator (IMOD) realized using microelectromechanical systems (MEMS) technologies, where the array of pixels can selectively absorbs and/or reflects light based on destructive and/or constructive light interference. One example of such an array is the Mirasol device by Qualcomm. In one example, a 5 mm square array can be used as one side of the resonator of the laser apparatus for a typical low-power diode application. Each pixel of the array may comprise a pair of conductive plates controllable using electrical signals for relative motions therebetween. For example, one plate may be a stationary layer over a substrate and the other plate may be a movable metallic membrane separated from the stationary layer by a transparent medium (e.g., an air gap). The relative position of the movable membrane can change the optical interference of light incident on the membrane.

In one embodiment, the digital micromirror array 206 not only can selectively reflect light, pixel-by-pixel in a two-dimensional (2-D) fashion, but also can select light of specific wavelengths for reflection. The pixels can also be controlled collectively. In general, the 2-D reflectivity can have a complex form, and the reflection coefficients include both real and imaginary components, where the imaginary components are associated with phase shifts of light during reflection. According to one embodiment, the micromirror array 206 is controllable for its 2-D reflection coefficients including the imaginary components, thereby allowing phase controls of the wave front from the array.

In one example operation, the array may be set to non-reflective for a short duration (e.g., microseconds), allowing a large population inversion in the active layer. Next, selected modes can be switched on, for example by controlling a portion of the micromirror array at the back side of the resonator to have a high reflectivity similar to a conventional passive mirror (e.g., with a reflectivity ~99%). The modes that used that portion of the high-reflectivity mirror may begin to resonate in a "giant first pulse," which may then exit the output coupler in the corresponding portion. Some other pixels of the micromirror array can then be "switched on," providing the other portion of the output coupler with a pulse of light offset in time by a short duration (e.g., nanoseconds), resulting in the steering of the output beam by phase difference.

The front (output) side of the resonator 204 can be a output coupler facet 208 having a Brewster's angle to output polarized light. The reflective surface of the micromirror array 206 and the facet 208 can cause interferometric resonance of light in the resonator 204. Compared with modulating light from outside the resonator, the illustrated embodiment provides light modulation and interferometric resonance within the resonator. That is, the reflective surface of the micromirror array 206 is part (e.g., back surface) of the resonator.

A first collimating lens 210 can be included in the resonator 204, and configured to collimate light 212 from the backside of the laser diode 202 toward the micromirror array 206. Collimated light 212 can be more precisely controlled/modulated, pixel-by-pixel, with the micromirror array. A second collimating lens 214 can be disposed on the output side of the laser apparatus 200 and outside the resonator 204, to collimate the output laser beam 216.

According to one embodiment, by digitally controlling the reflectivity of the micromirror array 206, the laser device 200 can be Q-switched extremely rapidly. Using the 2-D spatial arrangement of the micromirror array pixels 206a, 206b, 206c, . . . , and adjusting the phase relations among their respectively reflected light in real time, the embodiment disclosed herein allows not only shaping of the output wave front, but also steering of the beam 216 in a way similar to a phased array radar.

High output powers can be achieved using the Q-switched method, and the wave front shaping can assist in the removal of thermal distortions in the output beam 216. The laser diode 202 can be rapidly modulated by changing the electric field in its active region. Further, giant first pulses can be suppressed when the laser apparatus 200 is used in the Q-switch mode.

Figure 3:
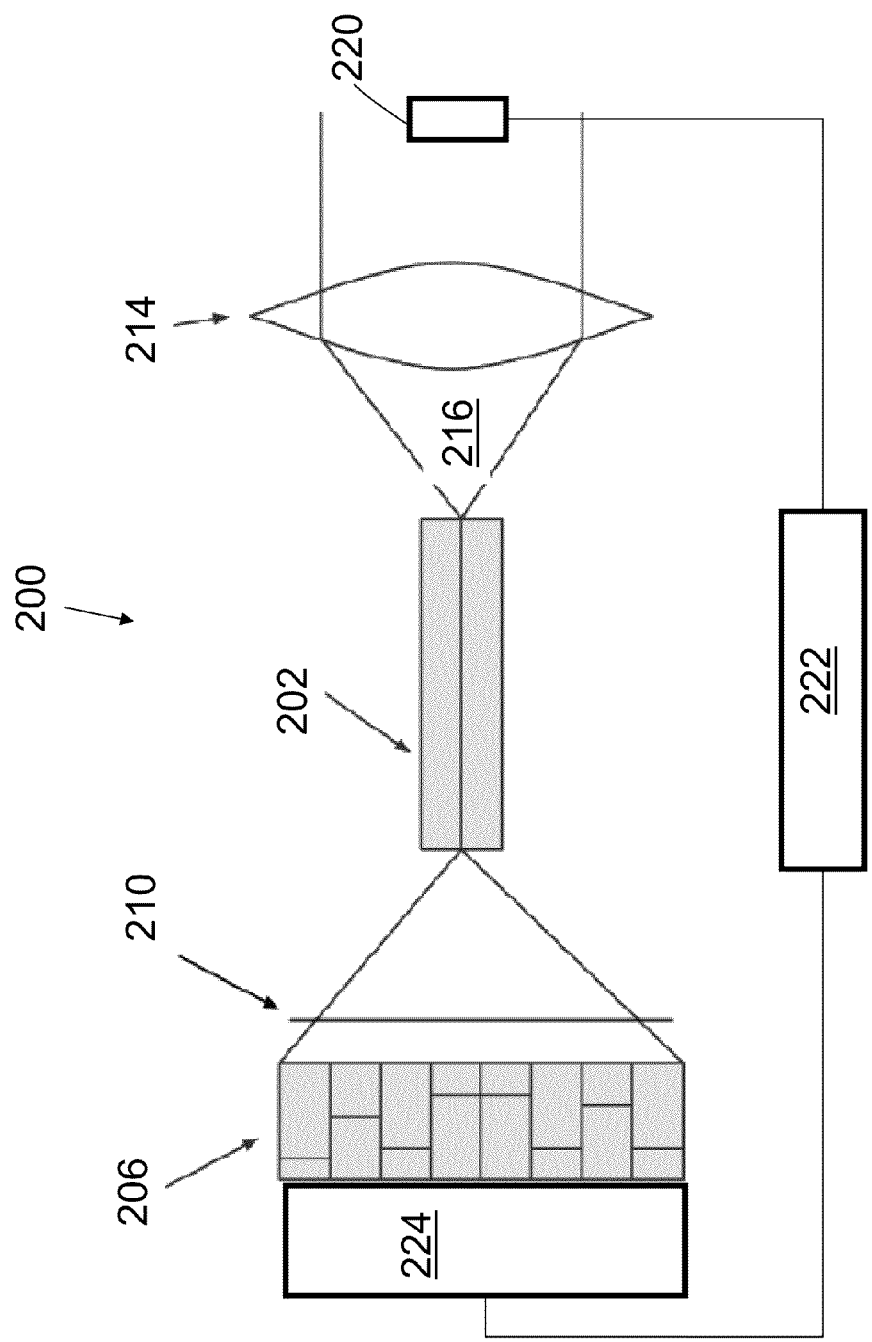
FIG. 3 illustrates a laser apparatus including a beam sensor and a feedback control circuit according to another embodiment of the invention.

As illustrate in FIG. 3, in one embodiment, the laser apparatus 200 also includes a beam sensor 220 disposed in the output laser beam 216. The beam sensor 220 can include, for example, a beam picker and a phase sensor. The beam picker can be a low-reflectivity mirror that provides a low-intensity image of the beam 216. The phase sensor can be an interferometric device that combines the beam 216 being sensed with a reference beam that has travelled a different distance. By measuring the intensity of the resultant beam, the phase of the output beam 216 can be measured with respect to the reference beam.

In one embodiment, the beam sensor 220 is a 2-D sensor array, and can measure the laser beam quality data across a 2-D plane in the laser beam 216. In another embodiment, the beam sensor 220 can raster-scan the laser beam 216 to obtain the beam quality data across the laser beam.

The sensed data from the beam sensor 220 can be fed to a control circuit 222, which in turn generates digital control signals for controlling a controller 224 to adjust reflectivity of individual pixels of the micromirror array 206. As a result of the 2-D control of the reflectivity, it is possible to mode-lock the resonator in any mode that is desirable, even ones that may not be stable with a passive external cavity-laser diode. The beam sensor 220, the control circuit 222, and the controller 224 may be viewed as a feedback control loop that adaptively adjusts the laser beam quality, mode-locks the laser, Q-switches the laser, and/or steers the laser in real time.

A method is therefore provided for mode locking, Q-switching beam shaping, and/or steering using an interferometric light modulator inside the resonator. Using a micromirror array device such as a MEMS device, the flux density can be shaped within the active channel of the laser device. Compared with controlling the laser beam externally, such as using a 2-D filter to filter out undesired light, fewer photons are wasted by controlling the light within the resonator. Thus, the embodiments disclosed herein can have a higher efficiency.

The recirculating power densities in the active layer are very high. For example, given a 1% transmission rate at the output coupler, the recirculating beam is about a hundred times greater. Thus, an absorber/modulator disposed inside the resonator may have a damage threshold that is difficult to achieve, particularly absorbers at the scales involved (e.g., hundreds of micrometers).

A digital light processing (DLP) "diverter" may be used to divert the unwanted photons to a beam dump outside the laser diode die. A liquid crystal display (LCD) may also be used either as a switchable absorber, or as a controllable retarder (shifting the phase before feeding it back, thus producing destructive interference within the active region). However, placing the controllable device outside the resonator does not allow Q-switching or control of the dimensions of the active region. In addition, high levels of unwanted light may occur. For example, the laser diode may continue working with its normal power output and normal power consumption, even when the external controllable device would be turned off. In addition, LCDs may not have a sharp switching action, and may result in a large proportion of the energy being absorbed in the LCD device.

In contrast, in the inventive embodiment, when the intracavity modulator (e.g., the micromirror array) is turned off, only spontaneous emission is absorbed within the device, and the power consumption of the system is much smaller.

Figure 4:
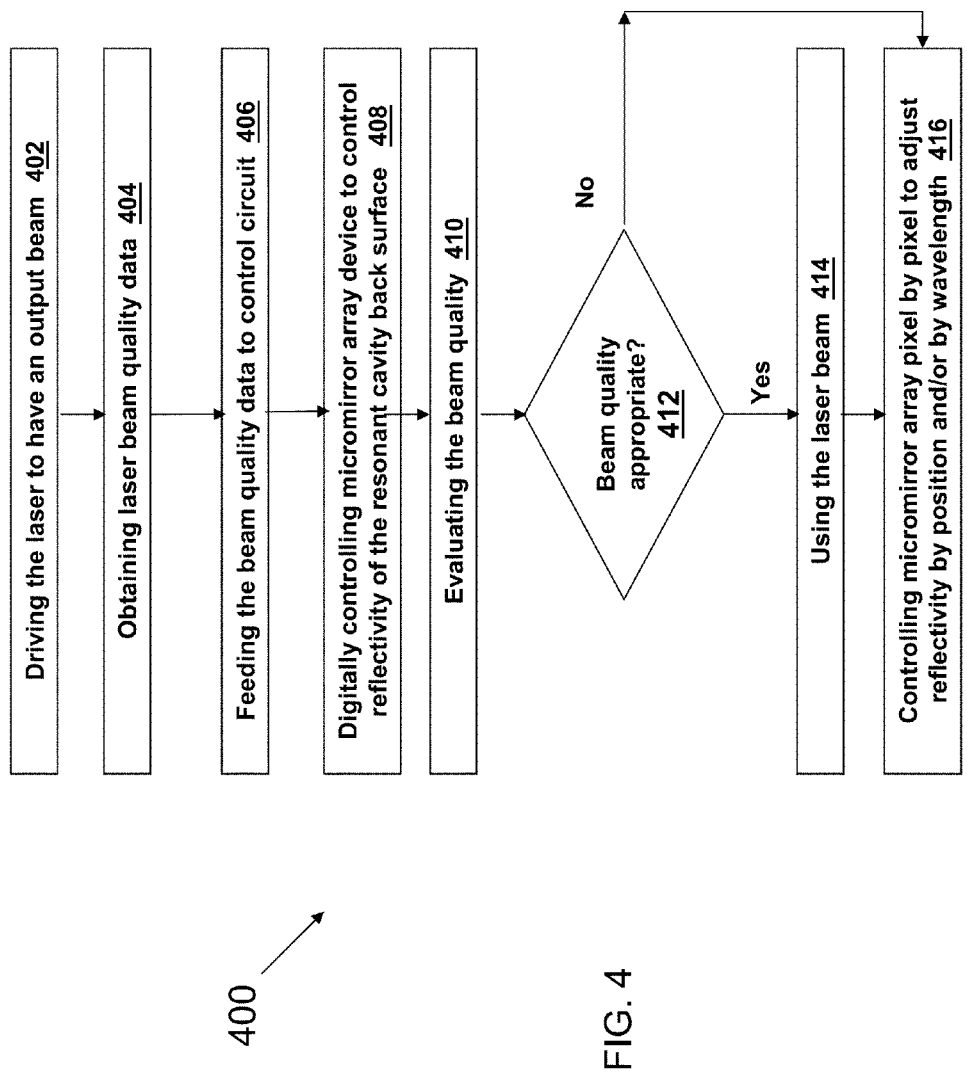
FIG. 4 is a flowchart illustrating a method for controlling a laser according to one embodiment of the invention.

An example method 400 is illustrated in FIG. 4. In operation 402, a laser diode is driven with an injection electrical current to lase and output a laser beam. In operation 404, laser beam quality data are obtained, for example using the beam sensor including the beam picker and the phase sensor. In operation 406, the measured laser beam quality data are fed into a control circuit. In operation 408, the control circuit in turn generates digital control signals to control a MEMS controller to digitally control the micromirror array to thereby control the reflectivity of the resonator back reflector surface. The control circuit may be configured to store the measured laser beam quality data in a memory, compare the laser beam quality data to a predetermined value or to an input from a user, and to generate an output signal for controlling the micromirror array adaptively to improve the laser beam quality toward desired specifications.

The beam quality is evaluated in operation 410. In operation 412, if it is determined that the beam quality is appropriate, then in operation 414 the laser beam can be used, for example in reading from or writing to an optical disc. If the beam quality is not appropriate, then in operation 416 the micromirror array can be controlled, pixel by pixel, to adjust reflectivity by position and/or by wavelength, thereby effecting the beam quality.

Figure 5:
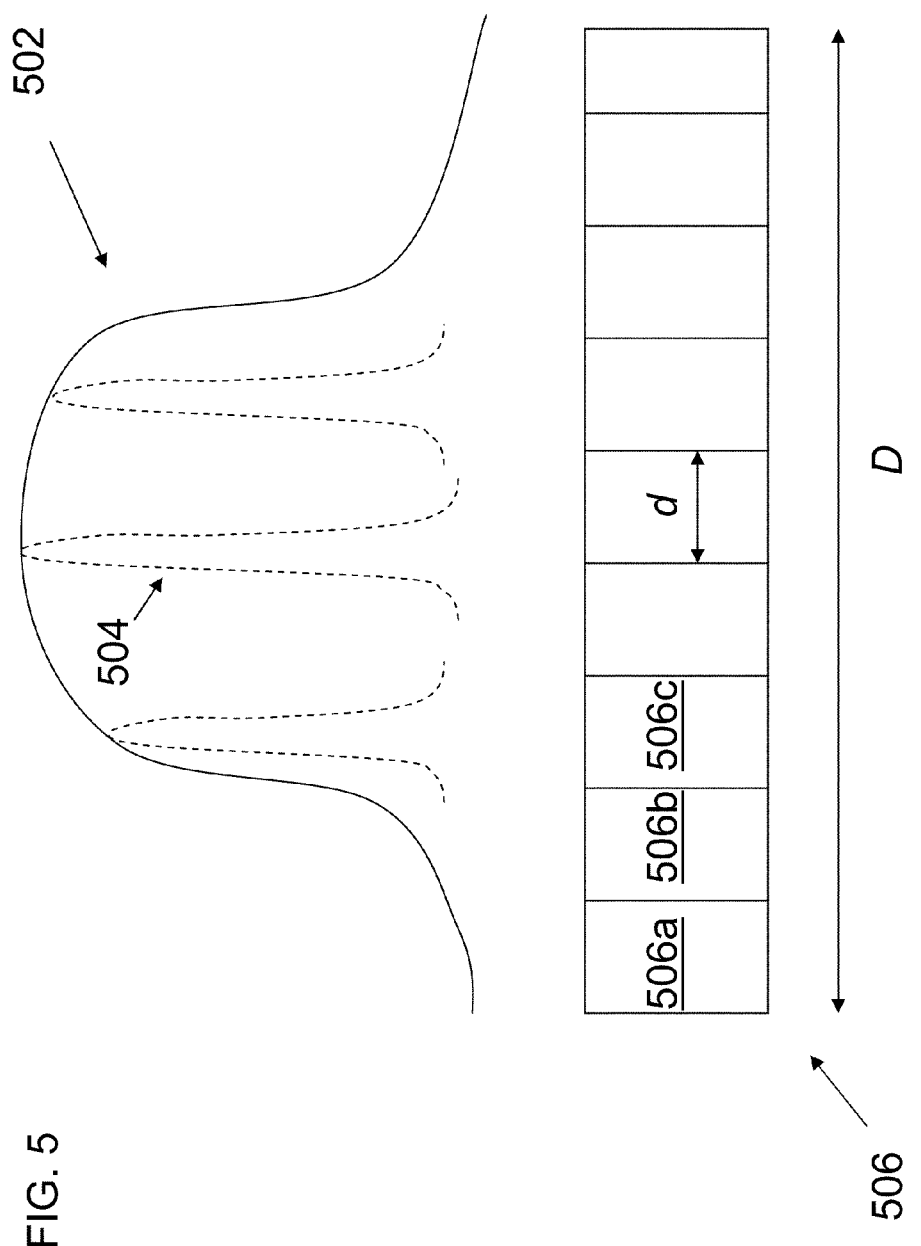
FIG. 5 illustrates a laser wave front envelope and the range of beam steering within the envelope.

FIG. 5 illustrates the principles of steering the laser beam using the micromirror array. As shown, a micromirror array device 506 having a width D comprises a plurality of pixels 506a, 506b, 506c, . . . each having a width d. Although the device 506 is illustrated in the simplified diagram as a 1-D array, it is noted that in practice the device 506 can be a 2-D array comprising a large number of reflective pixels distributed over a surface area.

A single pixel may correspond to a large envelope 502 of a wave front, which may have a beam divergence $\theta \sim 2.44 * \lambda / d$. With a number of n pixels, the beam can be narrowed to a narrow beam 504 with a $\theta \sim 2.44 * \lambda / D$, where $D = n \, d$. The narrow beam 504 can be generally steered within the large envelope 506, by controlling the reflectivity, center wavelength of reflection, and/or phases of the reflected light from the individual pixels. It is noted that although the envelope 506 is illustrated as a 2-D envelope, in practice it can be a 3-D envelope corresponding to a 2-D micromirror array device. With reference to FIGS. 1A and 1B, the range of the steering angle is approximately the same as the fast axis divergence of the laser diode. Depending on the aspect ratio of the diode die, the range of steering can be about 1 radian, for example.

The laser apparatus disclosed herein can have applications in many different areas. For example, the laser with the improved beam quality and the steering capability can be used as a laser source in an optical drive.

Figure 6:
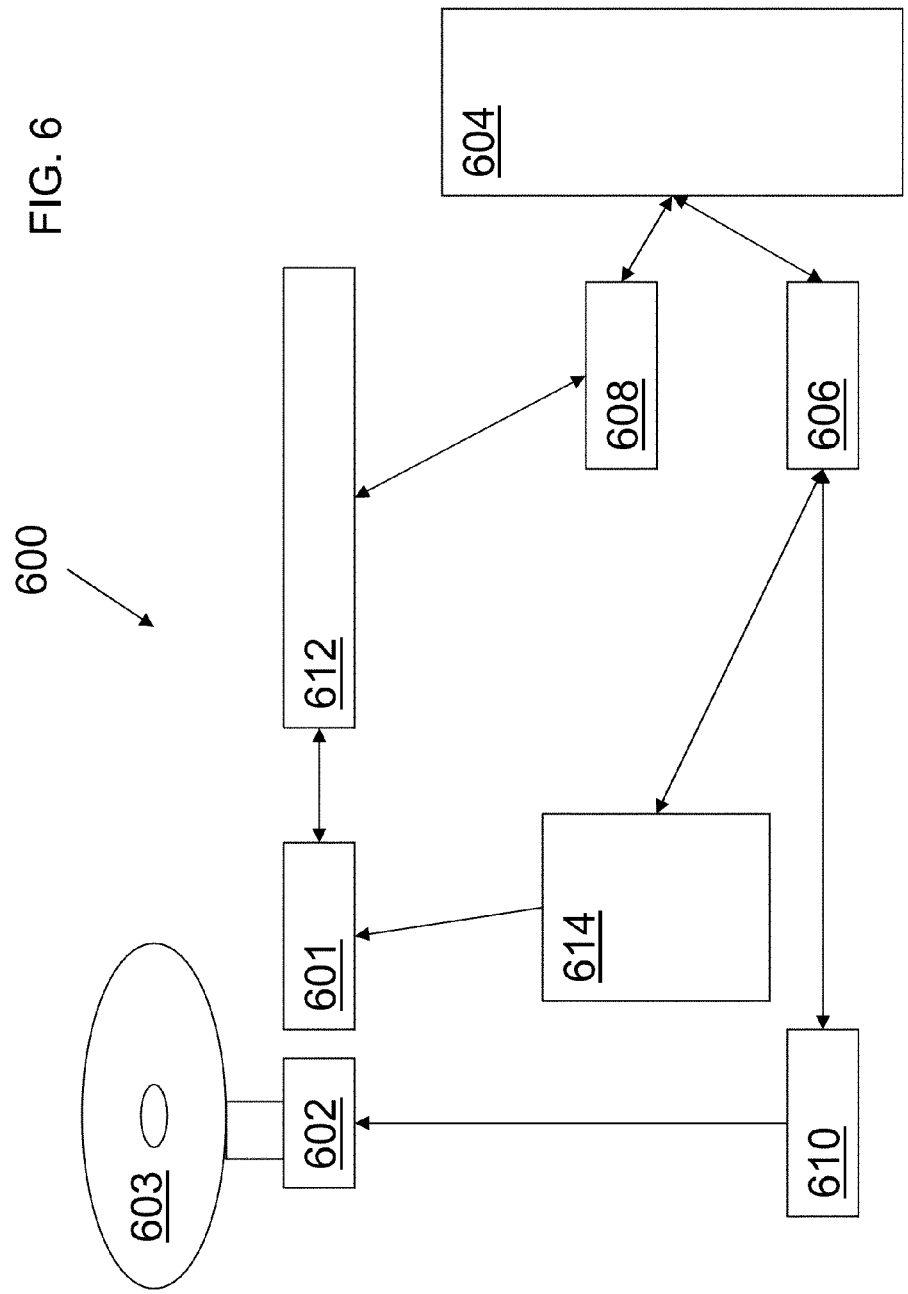
FIG. 6 is a block diagram illustrating an optical drive system including a laser apparatus according to one embodiment of the invention.

One example optical drive system 600 employing a laser apparatus 601 according to one inventive embodiment is illustrated in FIG. 6. The system 600 can be used to read from or write to a writable optical disc medium 603, such as a Digital Versatile Disc (DVD)-R, DVD+R, DVD-RW, DVD+RW, Blu-ray™ Disc-R, or BD-RE. The optical disc medium 603 can be driven by a spindle motor 602.

A host computer 604 controls a system controller 606 and an encoder/decoder 608. The encoder/decoder 608 can be coupled to a laser driver 612 to drive the laser apparatus 601. The system controller 606 can control a spindle circuit 610, and a servo circuit 614. The servo circuit can be used to focus the laser apparatus 601. The laser apparatus is controllable as described above. The controller for the micromirror array and the associated control circuit are not necessarily contained in the box 601, but may be distributed in the system 600, such as part of the laser driver 612 or the servo circuit 614.

The control circuit or other circuit elements may comprise any analog and/or digital electronic components (e.g., a microprocessor, microcontroller, application-specific integrated circuit, programmable logic, etc.) configured to perform the functions recited herein. The control method described above may be implemented as computer instructions stored on a non-transitory computer-readable medium. The medium may include, but not limited to, a hard disk drive, a Compact Disc (CD), a Digital Video Disk (DVD), a digital tape, memory, etc. The instructions may include obtaining beam quality data of the laser beam, feeding the beam quality data to a control circuit, generating digital control signals using the control circuit based on the beam quality data, and adjusting a two-dimensional reflectivity of a resonator back surface.

The system illustrated in FIG. 6 may be implemented as a plurality of control modules to perform these functions. For example, the system may include a beam sensor control module to obtain beam quality data, a feedback control module to generate digital control signals, and a MEMS control module to adjust the 2-D reflectivity of the resonator back surface.

The laser apparatus according to embodiments disclosed herein can also be used in display applications, where errors in the wave front may be magnified when the laser beams travel from the laser sources to the screen, causing distortions to the displayed images. By digitally controlling the wave front pixel by pixel, embodiments disclosed herein can provide large-screen displays of high image quality at a lower cost.

Laser devices often have temperature effects. For example, higher power results in higher temperature, which in turn leads to broader spectra of the output laser beams that are often undesirable. Conventional laser devices may rely on cooling to stabilize the temperature. In accordance with embodiments disclosed herein, the laser beam quality is controlled in real time based on the feedback from the beam sensor. Thus, the requirements for cooling may be reduced or eliminated. The laser devices disclosed herein can have higher optical power, be steered and switched faster and more precisely, and do not require complex optics or costly mechanical parts to focus or steer the laser beam, according to some exemplary embodiments.

VCSELs typically have distributed Bragg reflectors. The embodiments disclosed herein allow VCSELs to be tuned in their frequencies by controlling the micromirror array. Otherwise direct tuning using voltages applied over the active regions would be difficult because of the large capacitance of the laser device resulting from thin active layer of the VCSEL.

The possible tuning range depends upon the composition of the diode's active region, and may be comparable to the temperature tuning effect of that material, such as three or four nanometers for a 445 nm center frequency, or five or six nanometers for a 650 nm center frequency. A quantum-dot or mixed-dye laser may select between different lasing populations by this method, and therefore a wide spread of frequencies can be available. In another embodiment, a mixed rare-earth solid state laser (e.g., with a mixture of neodymium and europium) can be realized, and different lines can be selected.

In sum, an improved laser apparatus allows a versatile control of the output waveform. The wave front shape is also improved, and the output modulation can be flexible and adaptive. The laser apparatus can be used in a wide variety of applications, such as optical communications, digital recording, eye surgery systems, as well as enhanced, extra-fast laser display systems.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

The invention claimed is:

1. A laser apparatus comprising:
   a resonator including:
   an output facet configured to output a laser beam;
   a two-dimensional micromirror array having a controllable two-dimensional reflectivity to allow control of a two-dimensional wave front of the laser beam;
   a beam sensor disposed in a path traveled by the laser beam to measure beam quality data;
   a controller configured to individually control reflectivities of pixels of the micromirror array; and
   a control circuit configured to drive the controller based on feedback of the measured beam quality data.

2. The laser apparatus of claim 1, wherein the micromirror array comprises a MEMS device to digitally control Q-switching of the laser apparatus.

3. The laser apparatus of claim 1, wherein the micromirror array comprises a plurality of reflective pixels configured to be individually controllable in at least one of:
   a reflectivity;
   a phase of light reflected thereof; or
   a selective reflection of light of a specified wavelength.

4. The laser apparatus of claim 3, wherein the micromirror array is configured to steer the laser beam by selectively controlling phases of light reflected from the plurality of reflective pixels.

5. The laser apparatus of claim 3, wherein the micromirror array is configured to mode-lock the laser beam.

6. The laser apparatus of claim 1, wherein the output facet comprises a Brewster-angled surface to output polarized light.

7. The laser apparatus of claim 1, further comprising an active region disposed in the resonator.

8. The laser apparatus of claim 7, wherein the active region is that of a semiconductor laser diode.

9. The laser apparatus of claim 8, wherein the semiconductor laser diode is an edge-emitting laser diode or a VCSEL.

10. The laser apparatus of claim 9, wherein the semiconductor laser diode is a multi-mode laser diode.

11. The laser apparatus of claim 7, wherein the active region is that of an Nd:YAG laser.

12. The laser apparatus of claim 1, wherein the beam sensor comprises:
    a beam picker configured to obtain a low-intensity image of the laser beam; and
    a phase sensor configured to measure phases over the laser beam wave front.

13. The laser apparatus of claim 1, further comprising a first collimator lens disposed in the resonator and configured to collimate light toward the micromirror array.

14. The laser apparatus of claim 13, further comprising a second collimator lens disposed outside the resonator and in the laser beam to collimate the laser beam.

15. A method for controlling a laser beam, the method comprising:
    measuring beam quality data of the laser beam;
    feeding the beam quality data to a control circuit;
    generating digital control signals using the control circuit based on the beam quality data; and
    controlling a two-dimensional wave front of the laser beam by adjusting a two-dimensional reflectivity of a resonator back surface.

16. The method of claim 15, further comprising:
    Q-switching by controlling the two-dimensional reflectivity of the resonator back surface.

17. The method of claim 15, further comprising:
    steering the laser beam by controlling imaginary components of the two-dimensional reflectivity.

18. An optical drive system comprising:
    a laser apparatus including a resonator, wherein the resonator includes:
    an output facet configured to output a laser beam;
    a two-dimensional micromirror array having a controllable two-dimensional reflectivity to provide:
       a digitally-controlled Q-switching of the laser apparatus; and
       shaping of the laser beam wave front to thereby steer the laser beam;
    a drive circuit to control a quality of the laser beam;
    an encoder/decoder circuit to encode/decode the laser beam; and
    a host computer to control the drive circuit and the encoder/decoder circuit.

* * * * *